United States Patent
Suh et al.

(10) Patent No.: US 7,341,961 B2
(45) Date of Patent: Mar. 11, 2008

(54) METHOD OF MANUFACTURING THIN FILM TRANSISTOR, THIN FILM TRANSISTOR MANUFACTURED USING THE METHOD, AND FLAT PANEL DISPLAY DEVICE COMPRISING THE THIN FILM TRANSISTOR

(75) Inventors: Min-Chul Suh, Suwon-si (KR); Jae-Bon Koo, Suwon-si (KR)

(73) Assignee: Samsung SDI, Co., Ltd., Gyeonggi-do (KR)

( * ) Notice: Subject to any disclaimer, the term of this patent is extended or adjusted under 35 U.S.C. 154(b) by 121 days.

(21) Appl. No.: 11/280,480

(22) Filed: Nov. 15, 2005

(65) Prior Publication Data
US 2006/0103773 A1     May 18, 2006

(30) Foreign Application Priority Data
Nov. 16, 2004   (KR) ................ 10-2004-0093504

(51) Int. Cl.
*H01L 21/31*     (2006.01)
(52) U.S. Cl. ............... 438/781; 438/780; 438/99; 438/E51.005; 438/E51.006
(58) Field of Classification Search ............ 438/82, 438/99, 197, 455, 714, 780–781; 427/228
See application file for complete search history.

(56) References Cited

U.S. PATENT DOCUMENTS 6,498,114 B1 *  12/2002   Amundson et al. ......... 438/780

* cited by examiner

*Primary Examiner*—Dung A. Le
(74) *Attorney, Agent, or Firm*—Knobbe Martens Olson & Bear LLP

(57) ABSTRACT

Provided are a method of manufacturing an organic thin film transistor (TFT), the organic TFT manufactured using the method, and a flat panel display device comprising the organic TFT. The method includes: coating a lubricant on a predetermined region of a substrate where an organic semiconductor layer is not to be formed; coating an organic semiconductor layer on the entire substrate; heating the coated substrate to melt the lubricant; and releasing the organic semiconductor layer formed above the predetermined region from the substrate. According to the method, the organic semiconductor layer can be effectively patterned without damaging the substrate and the organic semiconductor material.

5 Claims, 3 Drawing Sheets

US 7,341,961 B2

METHOD OF MANUFACTURING THIN FILM TRANSISTOR, THIN FILM TRANSISTOR MANUFACTURED USING THE METHOD, AND FLAT PANEL DISPLAY DEVICE COMPRISING THE THIN FILM TRANSISTOR

CROSS-REFERENCE TO RELATED APPLICATIONS

This application claims the benefit of Korean Patent Application No. 10-2004-0093504, filed on Nov. 16, 2004, in the Korean Intellectual Property Office, the disclosure of which is incorporated herein in its entirety by reference.

BACKGROUND OF THE INVENTION

1. Field of the Invention

The present embodiments relate to a method of manufacturing a thin film transistor (TFT), a TFT manufactured using the method, and a flat panel display device comprising the TFT, and more particularly, to a method of manufacturing an organic TFT in which an organic semiconductor layer can be patterned in a simple manner, an organic TFT manufactured using the method, and a flat panel display device comprising the organic TFT.

2. Description of the Related Art

Flat panel display devices, such as liquid crystal display devices, organic and inorganic light emitting display devices, etc., include TFTs. The TFTs function as both switching devices to control the operation of pixels and driving devices to operate the pixels.

A TFT includes a semiconductor layer, which includes source and drain regions both doped with high concentration impurities and a channel region interposed between the source and drain regions, a gate electrode insulated from the semiconductor layer and located on a region corresponding to the channel region, and source and drain electrodes contacting the source and drain regions, respectively.

Recently developed flat panel display devices are often thin and flexible. In order to achieve flexibility, the flat panel display devices are manufactured using a plastic substrate instead of a conventional glass substrate. When the substrate is composed of plastic, the manufacturing process must be performed at a low temperature since the plastic substrate is unstable to heat. Therefore, a conventional poly silicon TFT which is manufactured using a high temperature process cannot be used.

To overcome this problem, a TFT including an organic semiconductor is used. The organic semiconductor layer can be manufactured at a low temperature, and thus, the TFT can be produced at low cost. Such an organic TFT is described in Korean Laid-Open Patent Publication No. 2004-0049110.

However, in a conventional method of manufacturing an organic TFT, the organic semiconductor layer cannot be patterned with high accuracy and production costs cannot be satisfactorily reduced. Thus, there is a need to improve the accuracy of patterning and decrease the production costs.

SUMMARY OF THE INVENTION

The present embodiments provide a method of manufacturing an organic thin film transistor (TFT) in which an organic semiconductor layer can be patterned in a simple manner and with low production costs, an organic TFT manufactured using the method, and a flat panel display device comprising the organic TFT.

According to an aspect of the present embodiments, there is provided a method of manufacturing an organic TFT, comprising: coating a lubricant on a predetermined region of a substrate where an organic semiconductor layer is not to be formed; coating an organic semiconductor layer on the entire substrate; heating the coated substrate to melt the lubricant; and releasing the organic semiconductor layer formed above the predetermined region from the substrate.

According to another aspect of the present embodiments, there is provided an organic TFT manufactured using the method.

According to still another aspect of the present embodiments, there is provided a flat panel display device comprising the organic TFT.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Hereinafter, the present embodiments will be described in more detail with reference to the attached drawings.

Figure 1:
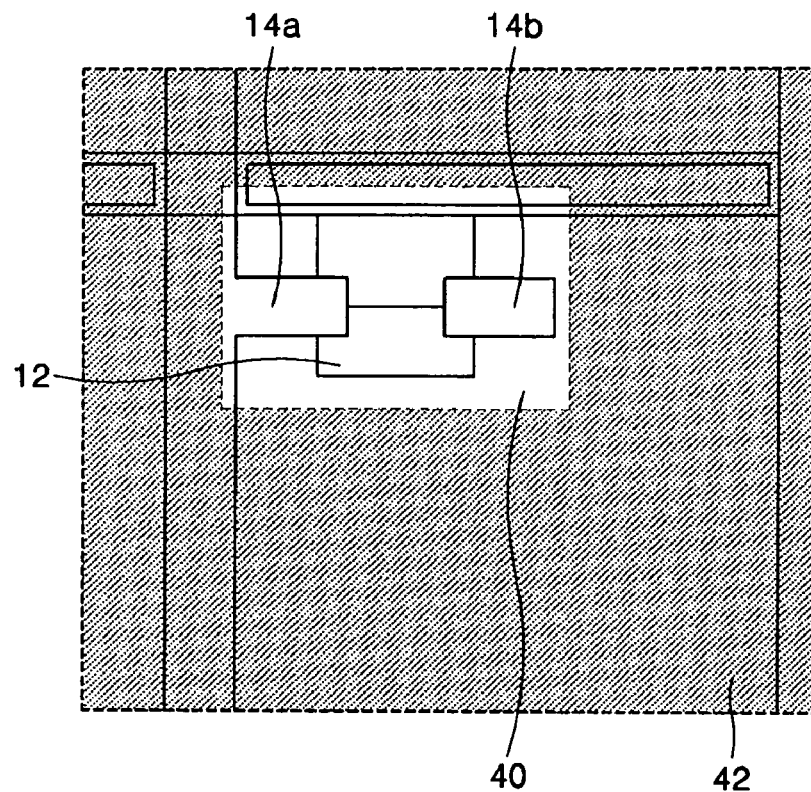
FIGS. 1 through 3 are plan views illustrating a method of manufacturing a thin film transistor (TFT) according to one embodiment.
Figure 2:
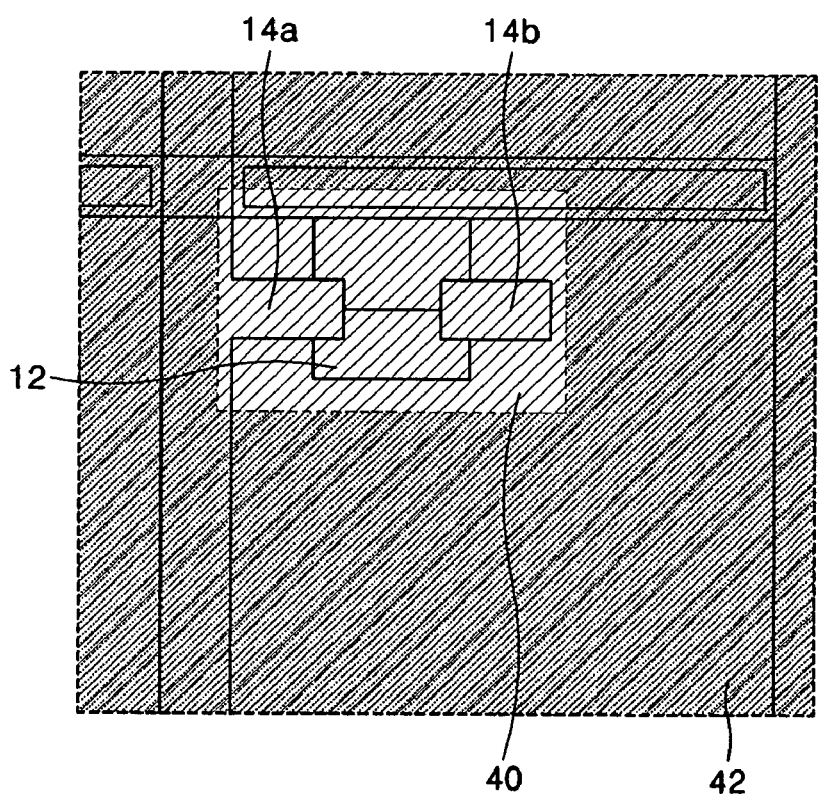
Figure 3:
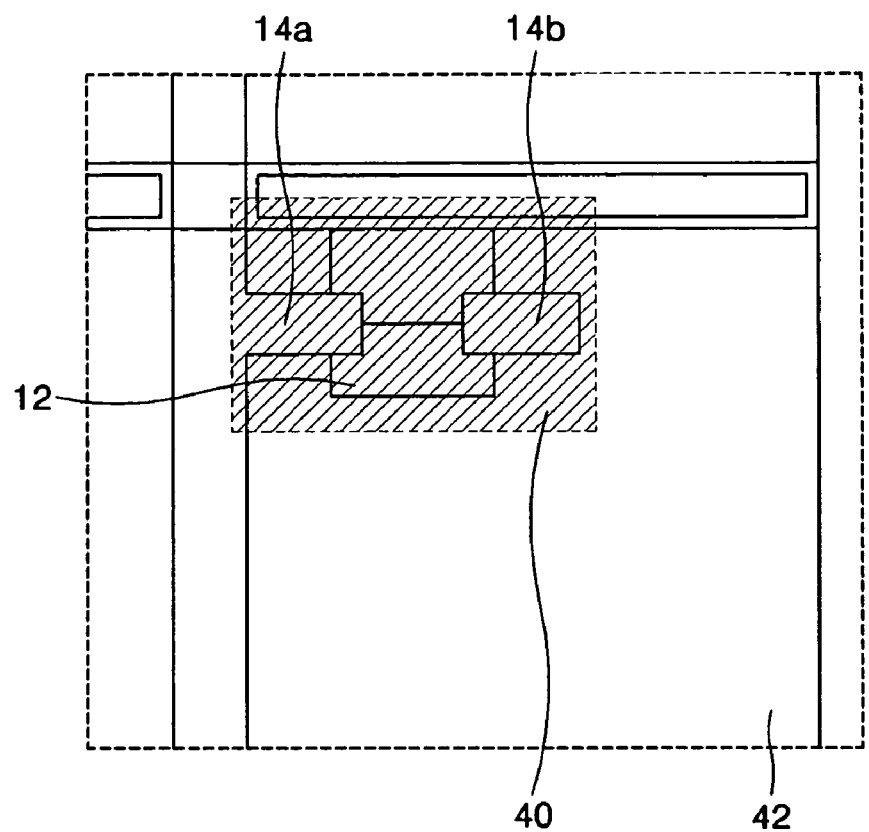

FIGS. 1 through 3 are plan views illustrating a method of manufacturing a TFT according to an embodiment.

Referring to FIG. 1, a lubricant is coated on a predetermined region of a substrate where an organic semiconductor layer is not to be formed (hereinafter, referred to as "organic semiconductor layer non-forming region") 42 of a substrate. A predetermined region of a substrate where an organic semiconductor layer is to be formed (hereinafter, referred to as "organic semiconductor layer forming region") 40 comprises a gate electrode 12 formed on a substrate made of glass or plastic, a source electrode 14a, a drain electrode 14b, and an insulating layer (not shown) insulating the gate electrode 12 from the source and drain electrodes 14a and 14b.

The lubricant coated on the organic semiconductor layer non-forming region 42 allows the organic semiconductor layer coated on the organic semiconductor layer non-forming region 42 to be easily removed from the substrate. Thus, the lubricant should be non-reactive to the materials comprising the substrate and the organic semiconductor layer and may be in a semi-solid or solid phase, rather than a liquid phase which could flow or spread after coating, such that it can define the organic semiconductor layer non-forming region 42 of the substrate. The lubricant may be a material having a relatively low melting point, for example, about 50 to about 100° C. considering the operation of melting the lubricant. Any conventional lubricant that can satisfy the above-mentioned conditions may be used.

Examples of the lubricant include, but are not limited to, grease. Grease refers to a semi-solid lubricant prepared by mixing a base oil with a thickener. The base oil may be, for example, diester oil or silicon oil and the thickener may be, for example, metallic soap, silica aerogel, or carbon black. The silicon oil, which can be used as the base in grease, has a viscosity coefficient which changes little according to a change in temperature and has a low solidifying point and thus, does not lose flowability at a low temperature. Further, the silicon oil is chemically inactive, has a low surface tension, and exhibits water repellence and defoaming and releasing effects. The thickener provides non-Newtonian behavior to the base oil and maintains the base oil in a semi-solid phase. Examples of the thickener include metallic soap, urea-based thickener, silica aerogel, bentonite, and carbon black. The metallic soap can be a metal salt of a fatty acid and can be obtained using a fatty acid and metal hydroxide as raw materials. The fatty acid may be a purified stearic acid and the metal hydroxide may be a hydroxide of an alkali metal, such as, lithium and sodium, or an alkali earth metal, such as calcium or barium. The urea-based thickener may be diurea, triurea, tetraurea, polyurea, etc. A grease produced using silicon oil as the base oil has low abrasion resistance and low extreme pressure resistance, and thus, it is difficult for it to be used in high load lubricating conditions for metal-to-metal interfaces. To overcome this problem, fluorosilicon oil in which a methyl group in its backbone is substituted with fluorine can be used in place of the silicon oil. Alternative examples of a lubricant include a wax, such as monohydric or dihydric alcohol fatty acid ester.

The lubricant may be coated on the organic semiconductor layer non-forming region 42 of the substrate using various methods. For example, the coating of the lubricant may be performed using a stamp having a pattern corresponding to a pattern of the organic semiconductor layer non-forming region 42. Particularly, a poly(dimethylene siloxane) (PDMS) stamp may be prepared as follows. First, a photoresist is coated on a silicon wafer and baked at from about 70° C. to about 120° C. Then, the photoresist is exposed to UV light such that a pattern corresponding to a pattern of the organic semiconductor layer non-forming region 42 can be formed, and then developed with a developer and dried. A precursor of PDMS is coated on the patterned photoresist layer and cured at from about 50° C. to about 100° C. to obtain a PDMS layer having the pattern of the organic semiconductor layer non-forming region 42. Next, the PDMS layer is released from the substrate to obtain a PDMS stamp. The lubricant is coated on a concave portion of the PDMS stamp, e.g., a portion corresponding to the pattern of the organic semiconductor layer non-forming region 42, and then the PDMS stamp is allowed to contact a substrate such that the lubricant can be coated on the organic semiconductor layer non-forming region 42. The method of coating the lubricant is not limited to this method of using the PDMS stamp.

Referring to FIG. 2, an organic semiconductor layer is coated on the entire substrate. That is, the organic semiconductor layer is coated on the lubricant formed on the substrate in the organic semiconductor layer non-forming region 42 and directly on the substrate in the organic semiconductor layer forming region 40. Specific examples of materials composing the organic semiconductor layer include, but are not limited to, at least one material selected from the group consisting of pentacene, tetracene, anthracene, naphthalene, α-6-thiophene, α-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylene vinylene and its derivatives, polyparaphenylene and its derivatives, polyfluorene and its derivatives, polythiophene vinylene and its derivatives, polythiophene-heterocyclic aromatic copolymer and its derivatives, oligothiophene and its derivatives, phthalocyanine which contains a metal (e.g., Cu), phthalocyanine which does not contain a metal, α-5-thiophene, pyromellitic dianhydride and its derivatives, and pyromellitic diimide and its derivatives.

After coating the organic semiconductor material, the coated substrate is heated to melt the lubricant. Preferably, the heating is performed without damaging the organic semiconductor material and the substrate of the organic TFT. For this, a vapor of an organic solvent may be used as a heat source. The organic solvent may be a solvent which has a low boiling point and is easily vaporized. Particularly, the organic solvent may be selected in consideration of a melting point of the grease. The organic solvent may have a boiling point greater than the melting point of the grease such that the grease can be easily melted. Examples of the organic solvent include, but are not limited to, hexane, cyclohexane, pentane, and cyclopentane. Among these, hexane is preferable. Hexane has a boiling point of 69° C. and its vapor is suitable for melting the lubricant without damaging the substrate and the organic semiconductor material.

After melting the lubricant coated on the organic semiconductor layer non-forming region 42, the organic semiconductor layer formed above the organic semiconductor layer non-forming region 42 is removed from the substrate, leaving the organic semiconductor layer only in the organic semiconductor layer forming region 40 of the substrate, as illustrated in FIG. 3.

In the method of manufacturing an organic TFT according to an embodiment, the organic semiconductor layer can be patterned without damaging the substrate and the organic semiconductor layer.

Figure 4:
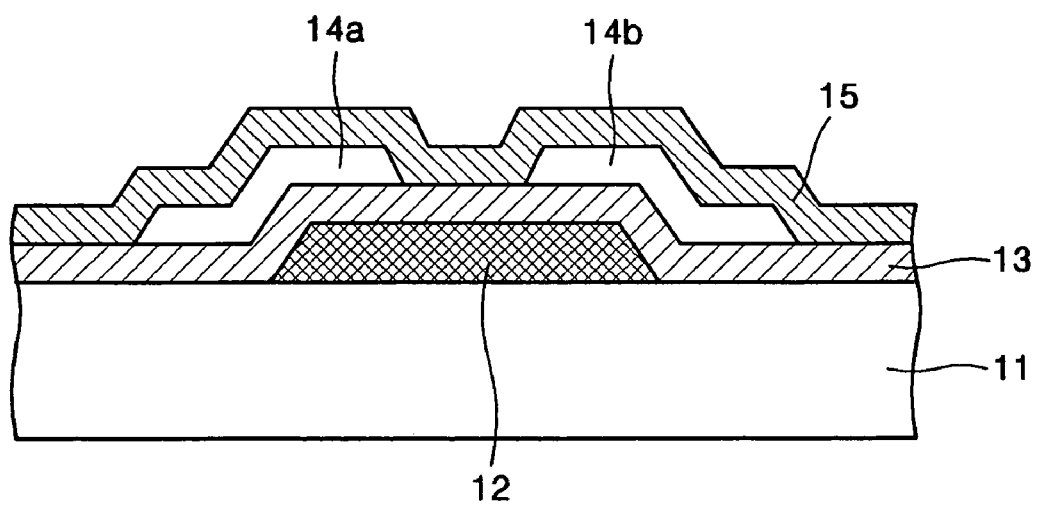
FIG. 4 is a schematic cross-sectional view of a TFT according to an embodiment.

FIG. 4 is a schematic cross-sectional view of an organic TFT manufactured using the method according to an embodiment.

Referring to FIG. 4, the organic TFT comprises a gate electrode 12 having a predetermined pattern and formed on a substrate 11 made of, for example, glass or plastic. The gate electrode 12 may be made of metal, such as Au, but is not limited thereto. An insulating layer 13 is formed on the gate electrode 12 and the substrate 11 and a source electrode 14a and a drain electrode 14b are formed on the insulating layer 13. The insulating layer 13 insulates the gate electrode 12 from the source and drain electrodes 14a and 14b. The source and drain electrodes 14a and 14b may partially overlap the gate electrode 12, but their positions are not limited thereto. An organic semiconductor layer 15 is formed on the source and drain electrodes 14a and 14b using the method described above.

Although the method of manufacturing an organic TFT and the organic TFT according to some embodiments were explained using the organic TFTs having the structure illustrated in FIGS. 1 through 4, these embodiments are not intended to limit the scope of the embodiments. That is, when manufacturing a TFT having a structure in which a gate electrode, an insulating layer, an organic semiconductor layer, and source and drain electrodes are sequentially formed on a substrate or a TFT having a structure in which source and drain electrodes, an organic semiconductor layer, an insulating layer, and a gate electrode are sequentially formed on a substrate, in addition to the TFT having the structure illustrated in FIG. 4, a method according to the present embodiment can be used. The meanings of the organic semiconductor layer forming region 40 and the organic semiconductor layer non-forming region 42 of the substrate will be understood by those of ordinary skill in the art.

An organic TFT manufactured using a method according to an embodiment can be included in various flat panel display devices, such as liquid crystal display devices, organic electroluminescent display devices, etc.

Figure 5:
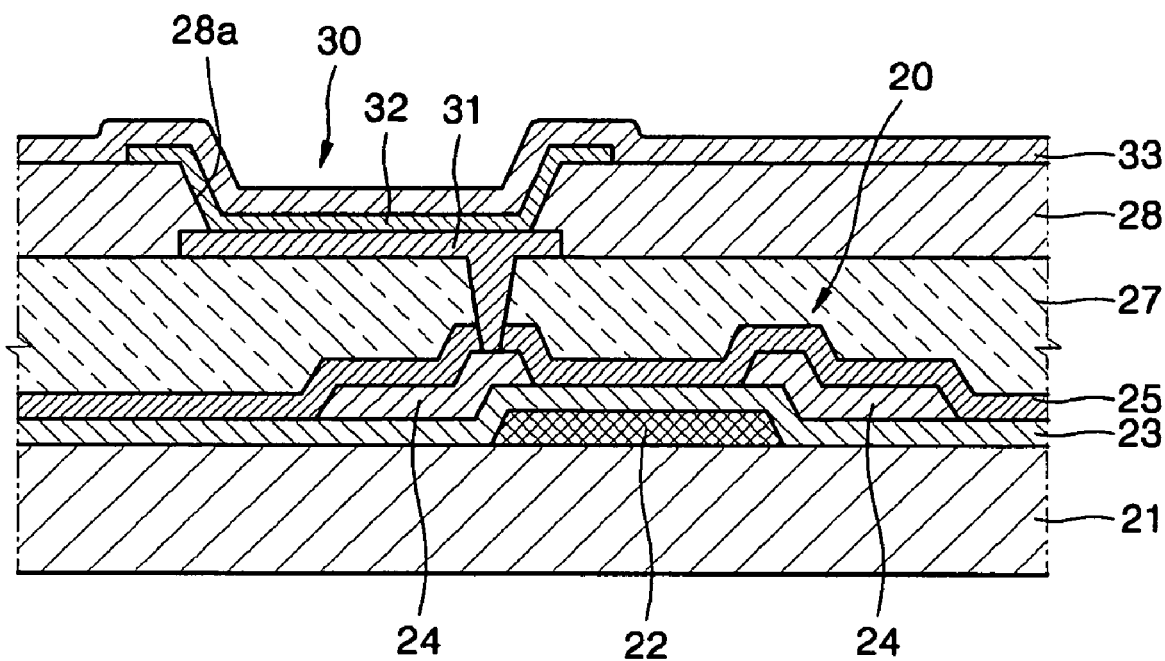
FIG. 5 is a schematic cross-sectional view of a sub-pixel of a flat panel display device comprising a TFT according to an embodiment.

FIG. 5 is a schematic cross-sectional view of a sub-pixel of an organic electroluminescent display device comprising a TFT according to one embodiment.

Referring to FIG. 5, the sub-pixel comprises a self-emitting organic electroluminescent (EL) device 30 and at least one TFT 20. The sub-pixel further comprises a capacitor (not shown). The TFT 20 may be one of those illustrated in the above embodiments, but is not limited thereto. The sub-pixel may comprise a TFT having another structure.

Referring to FIG. 5, the TFT 20 which is manufactured using the method described above, is formed on an substrate 21. Detailed descriptions of a gate electrode 22, an insulating layer 23, source and drain electrodes 24, an organic semiconductor layer 25, etc. on the TFT 20 are the same as described above and will not be repeated.

A passivation layer 27 is formed to cover the TFT 20. The passivation layer 27 may be a single layer or multiple layers. The passivation layer 27 may be composed of an organic material, an inorganic material, or an organic/inorganic composite.

A first electrode 31, which is one of a plurality of electrodes of the EL device 30, is formed on the passivation layer 27. After a pixel defining layer 28 is formed on the passivation layer 27, an opening 28a is formed through the pixel defining layer 28. An organic light-emitting layer 32 of the EL device 30 is formed on a region defined by the opening 28a.

The EL device 30 emits red, green, or blue light according to current flow to display images. The EL device 30 comprises the first electrodes 31 connected to one of the source or drain electrodes 24 of the TFT 20, a second electrode 33 covering all pixels, and the organic light-emitting layer 32 interposed between the first electrodes 31 and the second electrode 33 emits the light. The structure of an EL device according to the present embodiment is not limited to the above structure and may include organic EL display devices with various structures.

The organic light-emitting layer 32 may be a low or high molecular weight organic layer. The low molecular weight organic layer may include at least one of a hole injection layer (HIL), a hole transport layer (HTL), an emission layer (EML), an electron transport layer (ETL), or an electron injection layer (EIL). Examples of an organic material that can be used include copper phthalocyanine (CuPc), N,N'-di(naphthalene-1-yl)-N,N'-diphenyl-benzidine (NPB), and tris-8-hydroxyquinoline aluminum (Alq3), etc. The low molecular weight organic layer can be formed using vacuum deposition.

The high molecular weight organic layer may comprise an HTL and an EML. The HTL may be made of PEDOT (poly-3,4-ethylenedioxythiophene) and the EML may be made of a polyphenylenevinylene (PPV)-based or polyfluorene-based organic material, etc. The high molecular weight organic layer can be formed using screen printing or inkjet printing, etc.

The organic layer is not limited to the above layer, and may include various layers.

The first electrode 31 functions as an anode electrode and the second electrode 33 functions as a cathode electrode, or vice versa.

The TFT according to the present embodiment can be included in a sub-pixel, as illustrated in FIG. 5, and also in a driver circuit (not shown) where an image is not realized.

Hereinafter, the present embodiments will be described in more detail with reference to the following example.

EXAMPLE 1

A negative photoresist (SU-8) was coated to a thickness of 50 μm on a silicon wafer using a spin coater. The photoresist coated on the silicon wafer was baked at 90° C. for 15 minutes and exposed to UV light having a wavelength of 365 nm for 150 seconds using a photomask having a pattern corresponding to a pattern of an organic semiconductor layer non-forming region. The exposed photoresist layer was developed by being dipped in a developer (SU-8 developer) for 5 minutes and baked at 90° C., and then, a PDMS precursor was coated on the patterned photoresist layer. Then, the PDMS precursor was cured at 70° C. for about 2 hours to obtain a PDMS stamp. Grease was coated on a concave portion of the PDMS stamp. Then, the concave portion of the PDMS stamp was aligned with the organic semiconductor layer non-forming region of the substrate having a gate electrode, an insulating layer, and source and drain electrodes sequentially formed thereon, and then pressed, thereby coating the grease on the organic semiconductor layer non-forming region. Subsequently, pentacene was coated on the entire substrate, and then, hexane vapor was allowed to contact the grease through the coated pentacene layer to melt the grease. Next, the pentacene layer coated on the grease was removed from the substrate.

By using the method of manufacturing an organic TFT according to the present embodiments, an organic semiconductor layer can be patterned in a simple manner without damaging a substrate and an organic semiconductor layer, thus reducing production costs and providing high reliability.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing an organic thin film transistor (TFT), comprising:
   coating a lubricant on a predetermined region of a substrate where an organic semiconductor layer is not to be formed;
   coating an organic semiconductor layer on the entire substrate;
   heating the coated substrate to melt the lubricant; and
   releasing the organic semiconductor layer formed above the predetermined region from the substrate.

2. The method of claim 1, wherein the coating of the lubricant comprises using a stamp having a pattern corresponding to a pattern of the predetermined region of the substrate where the organic semiconductor layer is not to be formed.

3. A method of manufacturing an organic thin film transistor (TFT), comprising:
   coating a lubricant on a predetermined region of a substrate where an organic semiconductor layer is not to be formed;
   coating an organic semiconductor layer on the entire substrate;

heating the coated substrate to melt the lubricant; and releasing the organic semiconductor layer formed above the predetermined region from the substrate wherein the organic semiconductor layer comprises at least one material selected from the group consisting of pentacene, tetracene, anthracene, naphthalene, $\alpha$-6-thiophene, $\alpha$-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, poly paraphenylene vinylene and its derivatives, poly(paraphenylene) and its derivatives, polyfluorene and its derivatives, polythiophene vinylene and its derivatives, polythiophene-heterocyclic aromatic copolymer and its derivatives, oligothiophene and its derivatives, phthalocyanine which contains a metal, phthalocyanine which does not contain a metal, $\alpha$-5-thiophene, pyromellitic dianhydride and its derivatives, pyromellitic diimide and its derivatives.

4. A method of manufacturing an organic thin film transistor (TFT), comprising:

coating a lubricant on a predetermined region of a substrate where an organic semiconductor layer is not to be formed;

coating an organic semiconductor layer on the entire substrate;

heating the coated substrate to melt the lubricant; and releasing the organic semiconductor layer formed above the predetermined region from the substrate further comprising: a vapor of an organic solvent used as a heat source during the melting of the lubricant.

5. The method of claim 4, wherein the organic solvent includes at least one selected from the group consisting of hexane, cyclohexane, pentane, and cyclopentane.

* * * * *